US010054632B2

(12) United States Patent
Seong (10) Patent No.: US 10,054,632 B2
(45) Date of Patent: Aug. 21, 2018

(54) SEMICONDUCTOR APPARATUS AND CHARACTERISTIC MEASUREMENT CIRCUIT THEREFOR

(71) Applicant: SK hynix Inc., Icheon-si Gyeonggi-do (KR)

(72) Inventor: Jin Yong Seong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 18 days.

(21) Appl. No.: 15/225,912

(22) Filed: Aug. 2, 2016

(65) Prior Publication Data

US 2017/0276719 A1 Sep. 28, 2017

(30) Foreign Application Priority Data

Mar. 25, 2016 (KR) ........................ 10-2016-0036160

(51) Int. Cl.
*G01R 31/26* (2014.01)
*H01L 21/66* (2006.01)
*H01L 21/78* (2006.01)
*H01L 23/544* (2006.01)

(52) U.S. Cl.
CPC .......... *G01R 31/2601* (2013.01); *H01L 21/78* (2013.01); *H01L 22/14* (2013.01); *H01L 23/544* (2013.01); *H01L 2223/5446* (2013.01)

(58) Field of Classification Search
CPC .... G01R 31/2601; H01L 23/544; H01L 22/14
See application file for complete search history.

(56) References Cited

U.S. PATENT DOCUMENTS

| 4,970,454 A * | 11/1990 | Stambaugh ........ G01R 31/2884 324/73.1 |
| 6,442,740 B1 * | 8/2002 | Kanamoto .......... G06F 17/5022 703/16 |
| 6,593,590 B1 * | 7/2003 | Yang ...................... G11C 29/50 257/48 |
| 8,237,477 B1 * | 8/2012 | Hsieh ........................ H03L 1/00 327/149 |
| 2002/0006066 A1 * | 1/2002 | Kim ..................... G11C 29/006 365/201 |
| 2002/0075078 A1 * | 6/2002 | Bhakta ............. G11B 20/10037 331/1 A |
| 2003/0142565 A1 * | 7/2003 | McClure ................ G11C 29/50 365/201 |
| 2003/0145260 A1 * | 7/2003 | Yuan ................ G11C 29/12015 714/718 |
| 2005/0060109 A1 * | 3/2005 | Caffrey .................. G01R 27/02 702/65 |

(Continued)

FOREIGN PATENT DOCUMENTS

| KR | 1020020071666 A | | 9/2002 | |
| KR | 20030056851 | * | 7/2003 | ............. H01L 21/66 |
| KR | 1020030056851 A | | 7/2003 | |

*Primary Examiner* — Jermele M Hollington
*Assistant Examiner* — Alvaro Fortich
(74) *Attorney, Agent, or Firm* — William Park & Associates Ltd.

(57) ABSTRACT

A semiconductor apparatus may include a unit chip and a characteristic measurement circuit configured to include a plurality of unit elements for test and to output electrical characteristic information of the plurality of unit elements for test.

17 Claims, 11 Drawing Sheets

(56) References Cited

U.S. PATENT DOCUMENTS

| | | | |
|---|---|---|---|
| 2005/0222796 A1* | 10/2005 | Fuhrmann | G11C 29/12015 702/117 |
| 2007/0124634 A1* | 5/2007 | Shibuya | G01R 31/31725 714/731 |
| 2008/0143184 A1* | 6/2008 | Otsuga | G01R 19/0092 307/31 |
| 2008/0278142 A1* | 11/2008 | Takada | G01R 31/2884 324/76.12 |
| 2009/0016126 A1* | 1/2009 | Teramoto | G11C 29/02 365/194 |
| 2012/0224412 A1* | 9/2012 | Ueda | G11C 11/16 365/148 |
| 2013/0049836 A1* | 2/2013 | Yang | G01B 31/31854 327/203 |
| 2014/0021978 A1* | 1/2014 | Ikeda | G01R 31/2889 324/762.06 |
| 2015/0162318 A1* | 6/2015 | Allinger | H01L 22/26 257/48 |

\* cited by examiner

SEMICONDUCTOR APPARATUS AND CHARACTERISTIC MEASUREMENT CIRCUIT THEREFOR

CROSS-REFERENCES TO RELATED APPLICATION

This application claims priority under 35 U.S.C. 119(a) to Korean application No. 10-2016-0036160, filed on Mar. 25, 2016, in the Korean intellectual property Office, which is incorporated by reference in its entirety as set forth in full.

BACKGROUND

1. Technical Field

Various embodiments may generally relate to a semiconductor apparatus, and more particularly, to a semiconductor integrated circuit apparatus and a characteristic measurement circuit therefor.

2. Related Art

In general, after a plurality of semiconductor apparatuses (chips) are fabricated on one semiconductor substrate (wafer), the test on elements constituting the semiconductor apparatuses may be performed. After the test is performed at a wafer level, packaging processes on semiconductor apparatuses determined as normal chips may be performed. The chips which are determined as a normal chip in the package level test may be shipped as products.

The wafer level test may be performed through various methods. For example, an electrical parameter test may be performed to determine whether or not electrical characteristics of unit elements included in the semiconductor apparatus are predetermined characteristics. A functional test may be performed to determine whether or not the semiconductor apparatus is operated as designed.

The electrical parameter test may be performed by applying a fixed voltage to the unit element constituting the semiconductor apparatus.

The characteristics for the unit elements of the semiconductor apparatus may be referred in the waver-level and the package-level or even after the products are shipped.

SUMMARY

According to an embodiment, there may be provided a semiconductor apparatus. The semiconductor apparatus may include a unit chip. The semiconductor apparatus may include a characteristic measurement circuit provided within the unit chip and configured to include a plurality of unit elements for test and to output electrical characteristic information of the plurality of unit elements for test.

According to an embodiment, there may be provided a characteristic measurement circuit. The characteristic measurement circuit may include a control signal generation unit configured to generate a control signal. The characteristic measurement circuit may include a measurement unit configured to include a plurality of unit elements for test and to output electrical characteristic information of the plurality of unit elements for test. The control signal generation unit and the measurement unit may be included in a unit chip.

DETAILED DESCRIPTION

Examples of embodiments will be described with reference to the accompanying drawings. Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, embodiments should not be construed as limited to the particular shapes illustrated herein but may include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The concepts are described herein with reference to cross-sections and/or plan illustrations of idealized embodiments. However, the embodiments should not be construed as limiting. Although a few embodiments will be illustrated and described, it will be appreciated by those of ordinary skill in the art that changes may be made in these examples of embodiments without departing from the principles and spirit of the disclosure.

Figure 1:
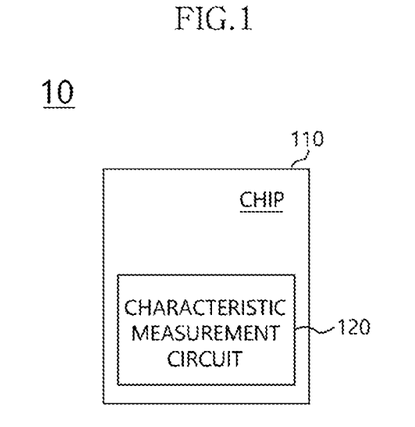
FIG. 1 is a configuration diagram illustrating a semiconductor apparatus according to an embodiment.

FIG. 1 is a configuration diagram illustrating a semiconductor apparatus according to an embodiment.

Referring to FIG. 1, a semiconductor apparatus 10 according to an embodiment may include a characteristic measurement circuit 120 included in a unit chip 110.

The unit chip 110 may be a semiconductor memory chip, but this is not limited thereto.

The characteristic measurement circuit 120 may include a plurality of unit elements for test and may be configured to output electrical characteristic information of each unit element in a test mode.

In an embodiment, the plurality of unit elements for test may be, for example but not limited to, a MOS transistor. The MOS transistor may include a plurality of low voltage NMOS transistors LVn, a plurality of low voltage PMOS transistors LVp, a plurality of high voltage NMOS transistors HVn, and a plurality of high voltage PMOS transistors HVp.

The characteristic measurement circuit 120 may measure an amount of current flowing through each unit element by driving the plurality of unit elements for test according to a control signal generated in the test mode. The plurality of unit elements for test may be driven with independent timings. In an embodiment, the characteristic measurement circuit 120 may measure a saturation current amount for each of the plurality of unit elements for test as the electrical characteristic information, but this is not limited thereto.

The plurality of unit elements for test may be test-only unit elements which are not used in an actual operation of the unit chip 110. As the characteristic measurement circuit 120 is provided in the unit chip 110, the characteristic measurement for the unit elements may be possible in the wafer level and the package level or even after the products are shipped.

Figure 2:
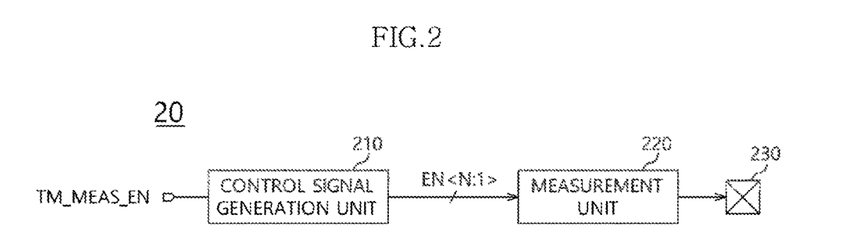
FIG. 2 is a configuration diagram illustrating a characteristic measurement circuit according to an embodiment.

FIG. 2 is a configuration diagram illustrating a characteristic measurement circuit according to an embodiment.

Referring to FIG. 2, a characteristic measurement circuit 20 according to an embodiment may include a control signal generation unit 210 and a measurement unit 220.

The control signal generation unit 210 may be configured to generate a control signal EN<N:1> in response to a test enable signal TM_MEAS_EN. The control signal EN<N:1> may be generated to drive the plurality of unit elements for testing at independent timings. In an embodiment, the control signal EN<n:1> may be generated in a plural group form, and each of the plurality of control signal groups may be generated in a plural bit form (N bits).

The measurement unit 220 may include the plurality of unit elements for test which are driven in response to the control signal EN<N:1> and coupled to a pad 230. In an embodiment, the plurality of unit elements for test may be driven one by one, that is, at mutual independent timings in response to the control signal EN<N:1> and an output current of the driven unit element for test may be applied to the pad 230.

As described above, the plurality of unit elements for test may include a plurality of transistors including a plurality of low voltage NMOS transistors LVn, a plurality of low voltage PMOS transistors LVp, a plurality of high voltage NMOS transistors HVn, and a plurality of high voltage PMOS transistors HVp. A gate terminal in each of the plurality of MOS transistors may receive the control signal EN<N:1>, a source terminal may receive an operation voltage, and a drain terminal may be coupled to the pad 230. Accordingly, an amount of current flowing through a MOS transistor driven in response to the control signal EN<N:1> may be measured through the pad 230.

The saturation current amount of the MOS transistor may be used as an important indicator in predicting a threshold voltage of the MOS transistor. In the technology, since the electrical parameter such as the saturation current amount for each of the various types of MOS transistors provided in the characteristic measurement circuit 120 of the unit chip 110 is measured, the characteristics of the unit elements constituting the corresponding chip 10 may be determined any time if necessary.

Figure 3:
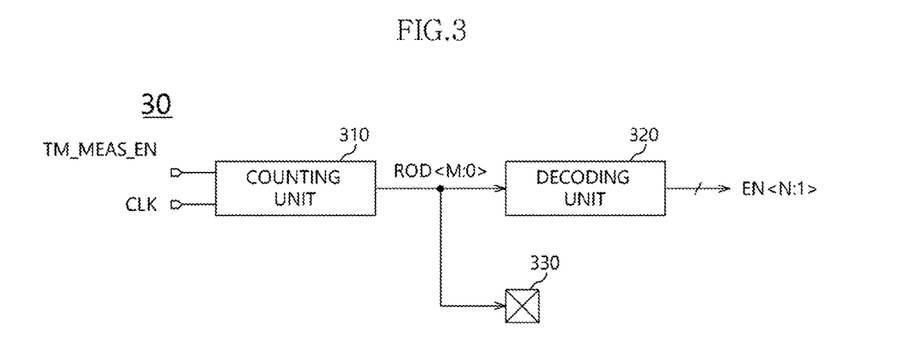
FIG. 3 is a configuration diagram illustrating a control signal generation unit according to an embodiment.

FIG. 3 is a configuration diagram illustrating a control signal generation unit according to an embodiment.

Referring to FIG. 3, a control signal generation unit 30 may include a counting unit 310 and a decoding unit 320.

The counting unit 310 may generate a counting signal ROD<M:0> in a digital signal form by counting a clock signal CLK in response to the test enable signal TM_MEAS_EN.

The unit chip 110 of the semiconductor apparatus may include a clock generation unit. In an embodiment, the counting unit 310 may generate the counting signal ROD<M:0> based on a clock signal provided from the clock generation unit included in the unit chip 110 located outside of the characteristic measurement circuit 120.

The decoding unit 320 may be configured to generate the control signal EN<N:1> in response to the counting signal ROD<M:0>.

The measurement unit 220 may drive the plurality of unit elements for test one by one in response to the control signal EN<N:1> which is enabled whenever the counting is performed.

The clock generation unit provided in the unit chip 110 of the semiconductor apparatus may be configured to include a ring oscillator, and the ring oscillator may have a structure whereby a plurality of inverters are coupled in series.

In an embodiment, the counting signal ROD<M:0> generated in the counting unit 310 in response to the clock signal CLK may be measured through the pad 330. It may be possible to measure performance of the clock generation unit, for example, to measure skew change and a delay amount difference according to the skew change through the measurement of the counting signal.

Figure 4:
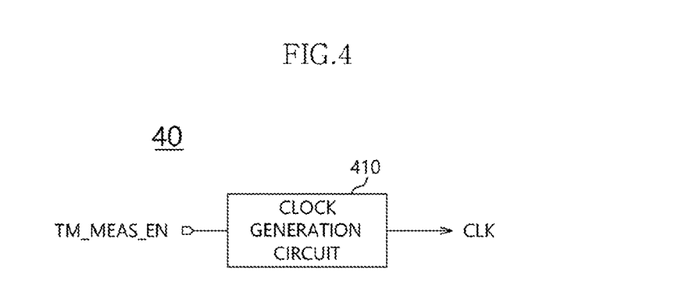
FIG. 4 is a configuration diagram illustrating a clock generation unit according to an embodiment.

FIG. 4 is a configuration diagram illustrating a clock generation unit according to an embodiment.

Referring to FIG. 4, the clock generation unit 40 may include a clock signal generation circuit 410 which generates the clock signal CLK in response to the test enable signal TM_MEAS_EN.

For example, the clock generation unit 40 illustrated in FIG. 4 may be included in the control signal generation unit 210, that is, the characteristic measurement circuit 20. In this example, the control signal generation unit 210 may further include the clock generation unit 40 in addition to the counting unit 310 and the decoding unit 320 illustrated in FIG. 3.

The control signal generation unit 30 may generate the counting signal ROD<M:0> and the control signal EN<N:1> using the clock generation unit 40 provided in the characteristic measurement circuit 120, and measure the skew change of the clock generation unit 40 and the delay amount difference according to the skew change based on the counting signal ROD<M:0>.

Figure 5:
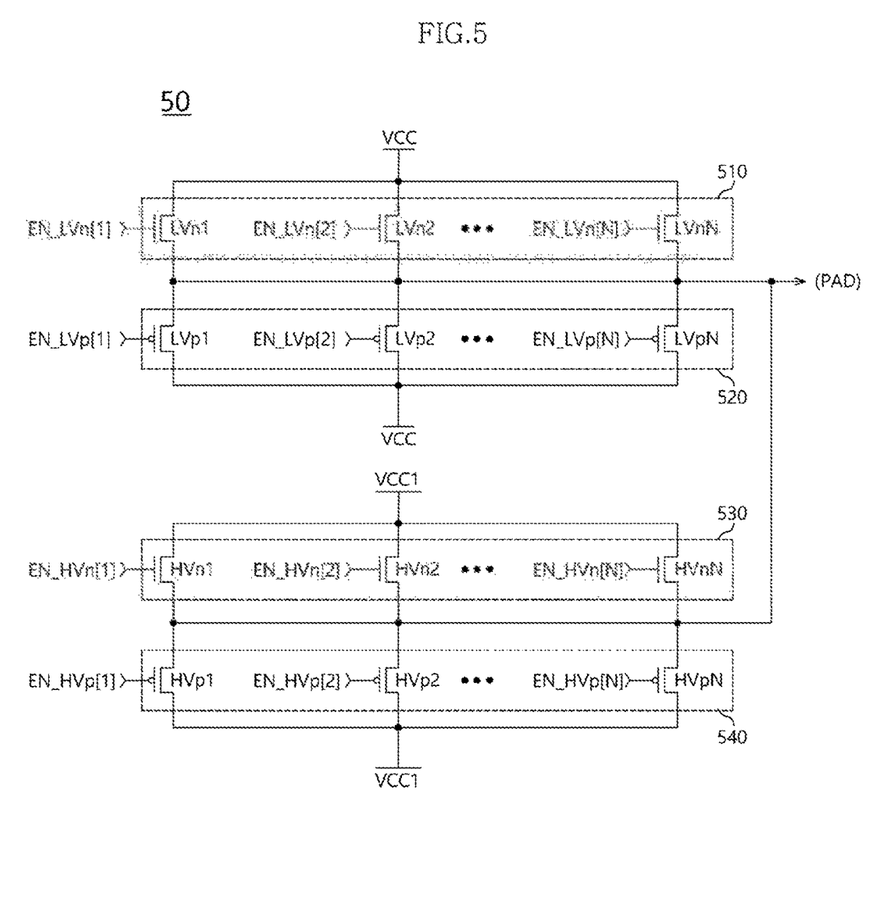
FIG. 5 is a configuration diagram illustrating a measurement unit according to an embodiment.

FIG. 5 is a configuration diagram illustrating a measurement unit according to an embodiment.

Referring to FIG. 5, a measurement unit 50 according to an embodiment may include a first unit element group 510, a second unit element group 520, a third unit element group 530, and a fourth unit element group 540.

The first unit element group 510 may include a plurality of low voltage NMOS transistors LVn1 to LVnN, and the plurality of low voltage NMOS transistors LVn1 to LVnN may be driven one by one in response to a first control signal group EN_LVn<N:1>.

The second unit element group 520 may include a plurality of low voltage PMOS transistors LVp1 to LVpN, and the plurality of low voltage PMOS transistors LVp1 to LVpN may be driven one by one in response to a second control signal group EN_LVp<N:1>.

The third unit element group 530 may include a plurality of high voltage NMOS transistors HVn1 to HVnN, and the plurality of high voltage NMOS transistors HVn1 to HVnN may be driven one by one in response to a third control signal group EN_HVn<N:1>.

The fourth unit element group 540 may include a plurality of high voltage PMOS transistors HVp1 to HVpN, and the plurality of high voltage PMOS transistors HVp1 to HVpN may be driven one by one in response to a fourth control signal group EN_HVp<N:1>.

In each of the low voltage MOS transistors LVn1 to LVnN and LVp1 to LVpN, a source terminal may receive a first operation voltage VCC and a drain terminal may be coupled to the pad (see 230 of FIG. 2).

In each of the high voltage MOS transistors HVn1 to HVnN and HVp1 to HVpN, a source terminal may receive a second operation voltage VCC1 and a drain terminal may be coupled to the pad (see 230 of FIG. 2). In an embodiment, for example, the second operation voltage VCC1 may be different from the first operation voltage VCC. In an embodiment, for example, the second operation voltage VCC1 may be greater than the first operation voltage VCC.

Figure 6:
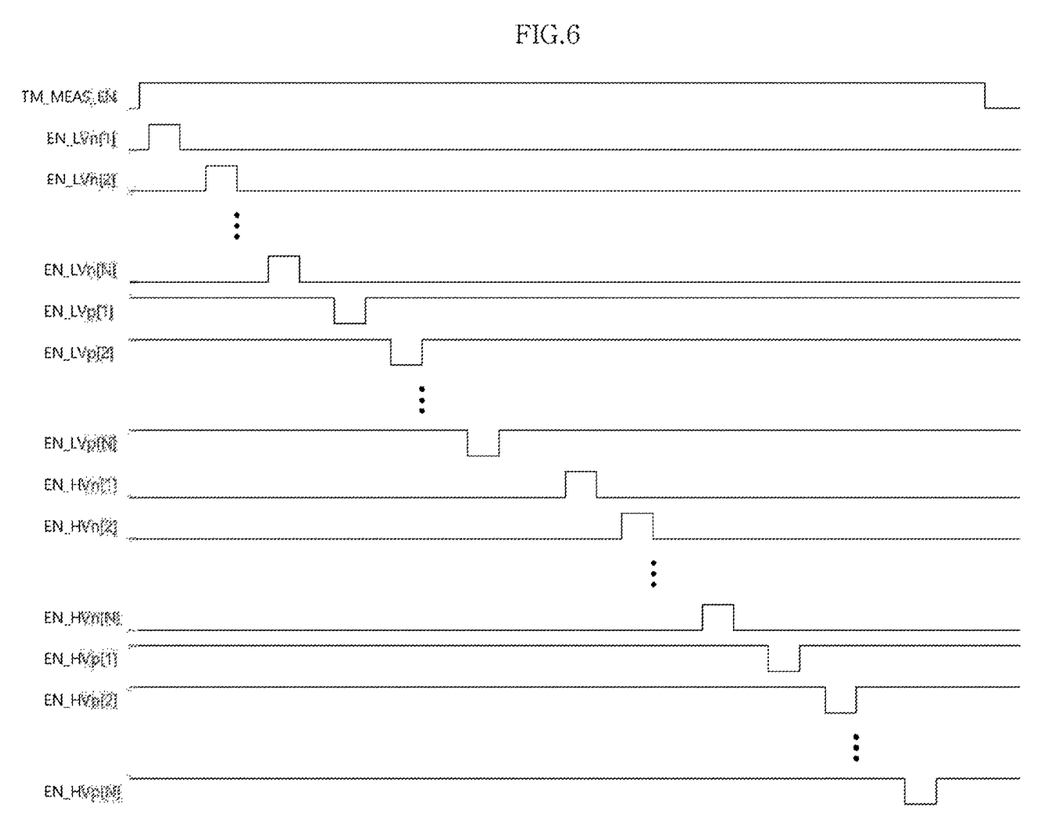
FIG. 6 is an operation timing diagram illustrating a characteristic measurement circuit according to an embodiment.

FIG. 6 is an operation timing diagram of a characteristic measurement circuit according to an embodiment.

The control signal groups EN_LVn<N:1>, EN_LVp<N:1>, EN_HVn<N:1>, and EN_HVp<N:1> may be sequentially enabled in response to the counting signal ROD<M:0> which is generated as a counting result of the clock signal CLK when the test enable signal TM_MEAS_EN is enabled.

The MOS transistors constituting the measurement unit 50 as illustrated in FIG. 5 may be driven at the independent timings and the measurement unit 50 may measure the current amount in each of the MOS transistors through the pad 230.

Figure 7:
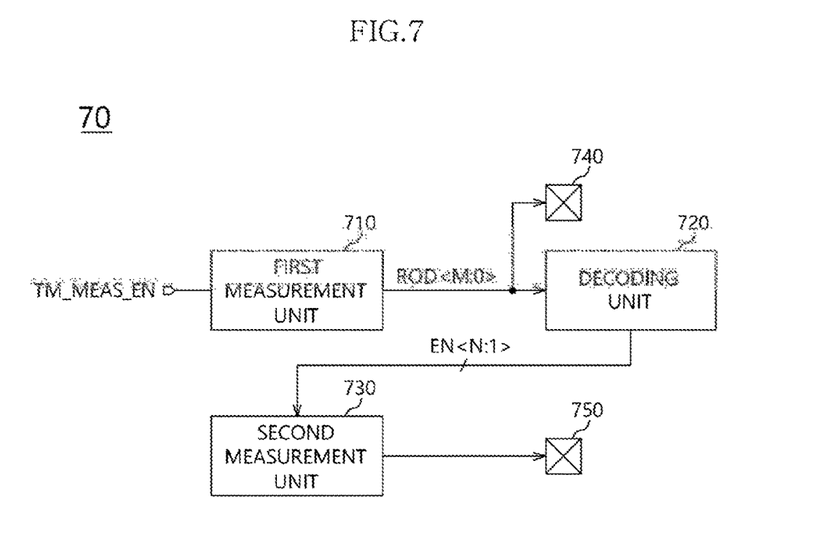
FIG. 7 is a configuration diagram illustrating a characteristic measurement circuit according to an embodiment.

FIG. 7 is a configuration diagram illustrating a characteristic measurement circuit according to an embodiment.

Referring to FIG. 7, a characteristic measurement circuit 70 according to an embodiment may include a first measurement unit 710, a decoding unit 720, and a second measurement unit 730.

The first measurement unit 710 may be configured to measure a skew of the clock signal and a delay amount difference according to the skew.

In an embodiment, the first measurement unit 710 may be configured to output the counting signal ROD<M:0> by counting the clock signal generated in response to the test enable signal TM_MEAS_EN. The counting signal ROD<M:0> may be provided to a test apparatus (not shown) through a first pad 740.

Figure 8:
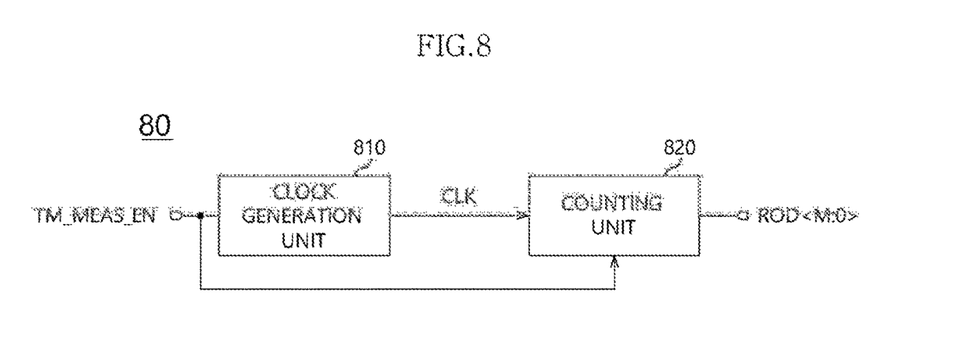
FIG. 8 is a configuration diagram illustrating a first measurement unit according to an embodiment.

FIG. 8 is an illustrative diagram illustrating a first measurement unit.

A first measurement unit 80 according to an embodiment may include a clock generation unit 810 and a counting unit 820.

The clock generation unit 810 may generate the clock signal CLK in response to the test enable signal TM_MEAS_EN. In an embodiment, the clock generation unit 810 may include a ring oscillator in which a plurality of inverters are coupled in series.

The counting unit 820 may generate the counting signal ROD<M:0> by counting the clock signal CLK. The counting signal ROD<M:0> may have a digital signal of plural bits.

The decoding unit 720 may be configured to generate the control signal EN<N:1> in response to the counting signal ROD<M:0>. The control signal EN<N:1> may be generated to drive the plurality of unit elements for test at independent timings. In an embodiment, the control signal EN<N:1> may be generated in a plural group form, and each of the plurality of control signal groups may be generated in a plural bit form (N bits).

The second measurement unit 730 may include the plurality of element units for test driven in response to the control signal EN<N:1>. In an embodiment, the plurality of unit elements for test may be driven one by one, that is, at mutual independent timings in response to the control signal EN<N:1>, and an output current of the driven unit element for test may be applied to a second pad 750.

In an embodiment, the second measurement unit 730 may be configured to include the measurement unit 50 illustrated in FIG. 5, but the embodiments are not limited thereto.

The characteristic measurement circuit 70 may measure performance such as the skew, the delay amount, and the like of the inverter constituting the clock generation unit 810 by receiving an output signal of the first measurement unit 710, that is, the counting signal ROD<M:0> through the first pad 740.

The characteristic measurement circuit 70 may measure the electrical characteristic such as the saturation current amount for each of the plurality of unit elements for test by receiving an output signal of the second measurement unit 730 through the second pad 750.

Figure 9:
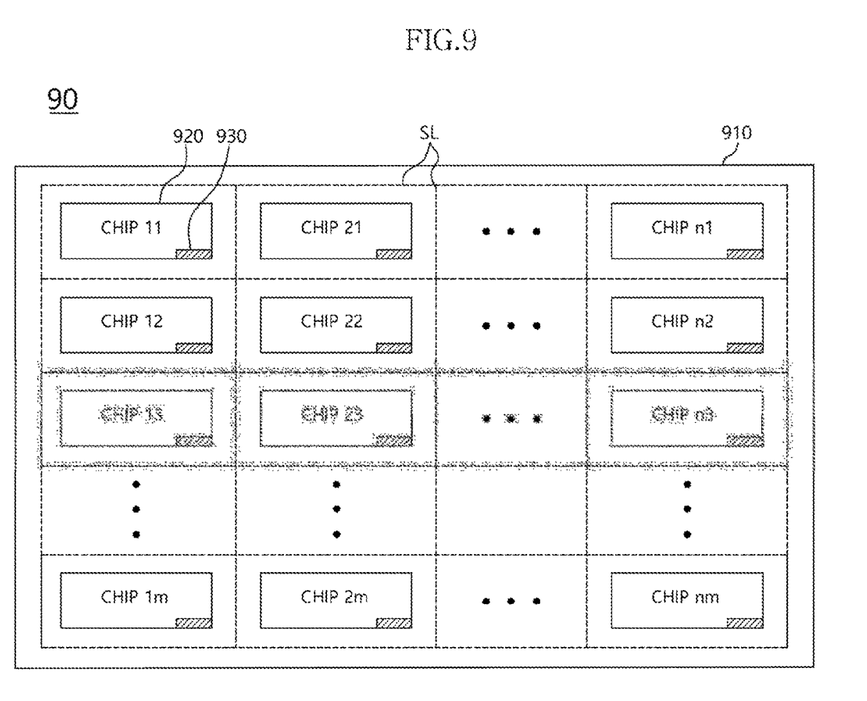
FIG. 9 is a configuration diagram illustrating a semiconductor apparatus according to an embodiment.

FIG. 9 is a configuration diagram illustrating a semiconductor apparatus 90 according to an embodiment.

Referring to FIG. 9, a plurality of chips 920 may be formed on a wafer 910.

A characteristic measurement circuit 930 may be embedded in each of the chips 920.

When the manufacturing of the chips 920 are completed, the wafer 910 may be individualized along a scribe lane SL.

Since the characteristic measurement circuit 930 is embedded in each chip 920, the device characteristics for each chip 920 may be measured in the wafer level and the package level, and if necessary, the device characteristics may be measured after the products are shipped.

Figure 10:
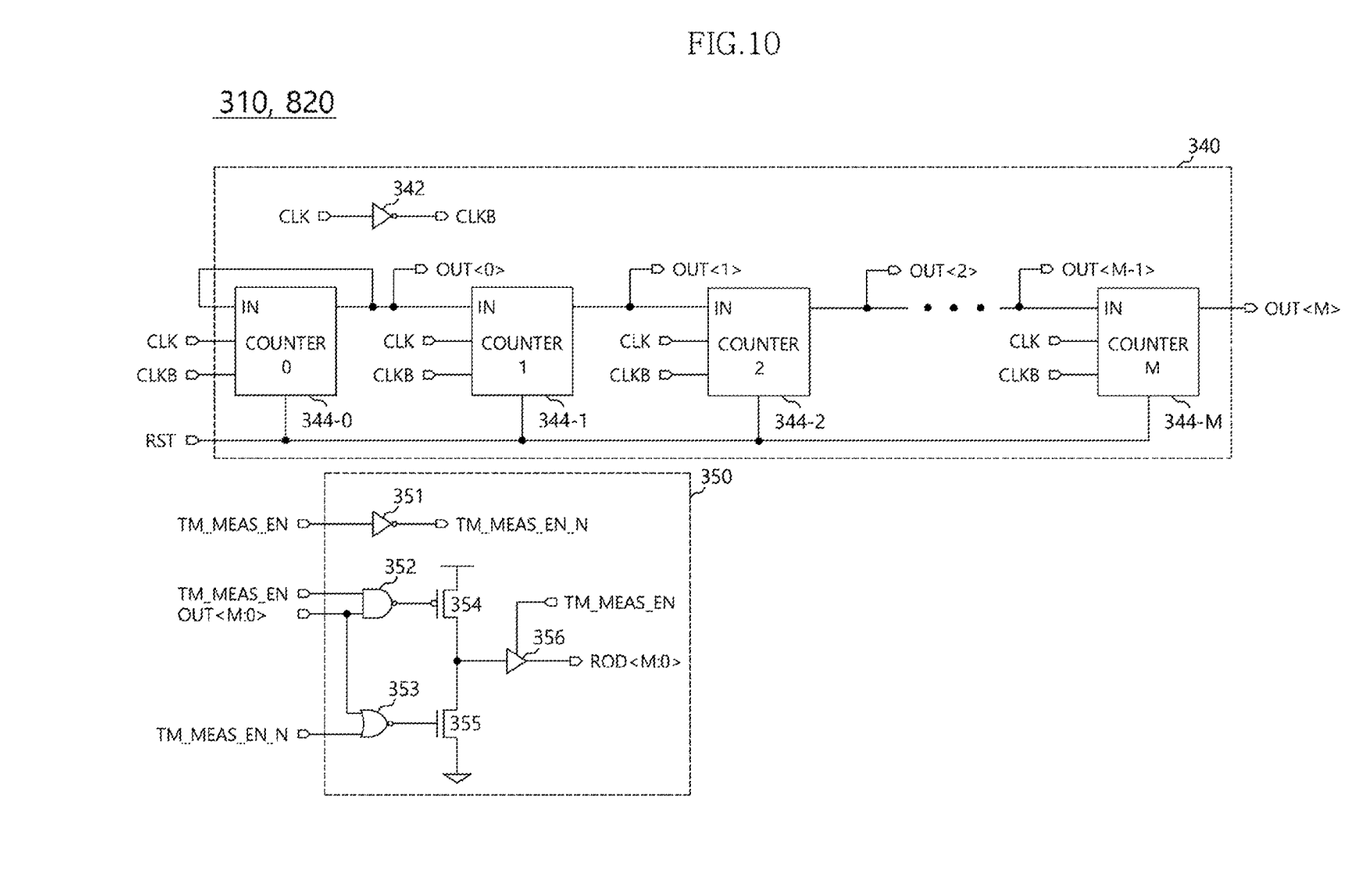
FIG. 10 is a configuration diagram illustrating a counting unit according to an embodiment.

Even when the counting unit 310 or 820 illustrated in FIG. 3 or 8 may be configured, for example, as a circuit illustrated in FIG. 10, but the embodiments are not limited thereto.

Referring to FIG. 10, the counting unit 310 or 820 according to an embodiment may include a counting circuit 340 and a counting signal generation unit 350.

The counting circuit 340 may be configured to output a plural-bit output signal OUT<M:0> in response to the clock signal CLK and an inverting clock signal CLKB. The inverting clock signal CLKB may be generated by inverting the clock signal CLK through an inverting unit 342.

In an embodiment, the counting circuit 340 may be configured by coupling a plurality of counters 344-0 to 344-M, which delay an input signal IN by a preset time and out the delayed input signal in response to the clock signal CLK and the inverting clock signal CLKB, in series.

In an embodiment, each of the counters 344-0 to 344-M may be configured of a falling edge or rising edge trigger D flip flop, but this and the embodiments are not limited thereto. The counters 344-0 to 344-M may be initialized in response to a reset signal RST.

The counting signal generation unit 350 may generate the counting signal ROD<M:0>, which is enabled whenever the output signal OUT<M:0> is enabled in an enable period of the test enable signal TM_MEAS_EN, in response to the output signal OUT<M:0> generated in the counting circuit 340 and the test enable signal TM_MEAS_EN.

In an embodiment, the counting signal generation unit 350 may include an inverting unit 351, a first combination unit 352, a second combination unit 353, a first switching unit 354, a second switching unit 355, and a driving unit 356.

The inverting unit 351 may be configured to generate the inverted test enable signal TM_MEAS_EN_N by inverting the test enable signal TM_MEAS_EN.

The first combination unit 352 may be configured to generate an effective output signal in response to the test enable signal TM_MEAS_EN and the output signal OUT<M:0> when two input signal TM_MEAS_EN and OUT<M:0> are in an enable state.

The second combination unit 353 may be configured to pull down an output potential of the first combination unit 352 in response to the inverted test enable signal TM_MEAS_EN_N and the output signal OUT<M:0> when two input signals TM_MEAS_EN_N and OUT<M:0> are in a disabled state.

The driving unit 356 may be configured to output the output signal of the first combination unit 352 as the counting signal ROD<M:0> in response to the test enable signal TM_MEAS_EN.

Figure 11:
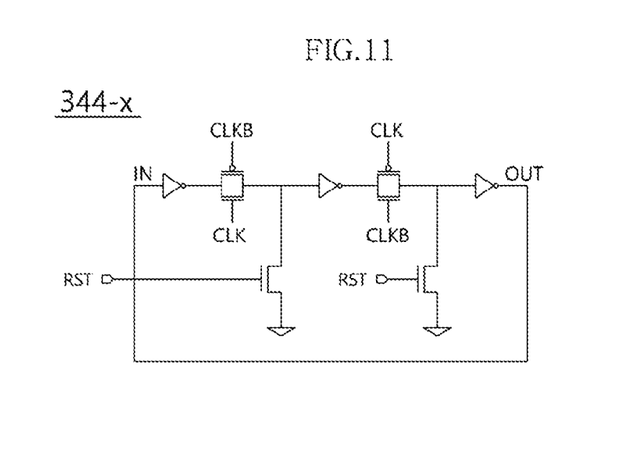
FIG. 11 is a configuration diagram illustrating a counter according to an embodiment.

FIG. 11 is a configuration diagram illustrating a counter according to an embodiment.

As illustrated in FIG. 11, the counter 344-x according to an embodiment may be configured to include a falling edge trigger D flip flop.

Figure 12:
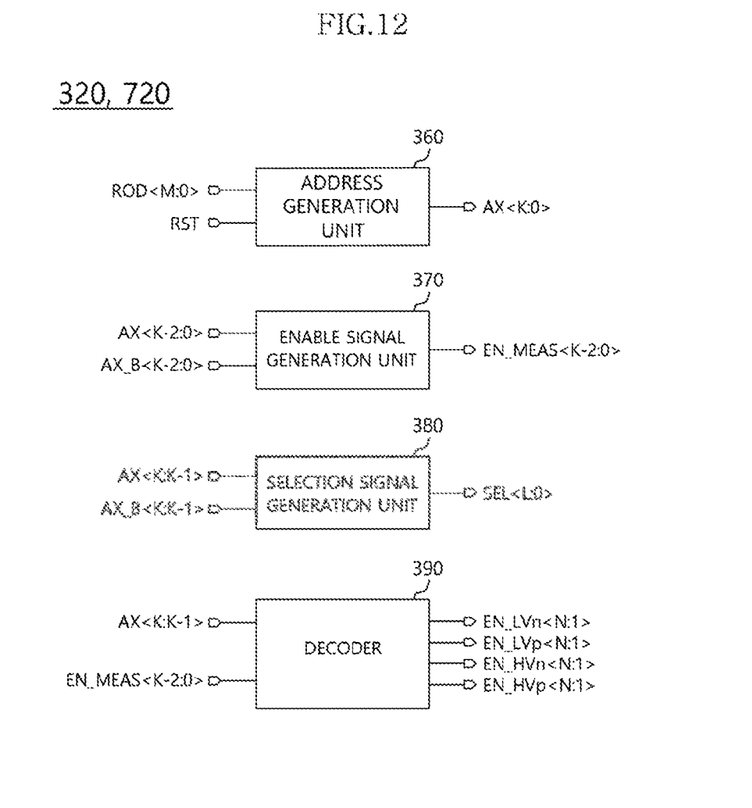
FIG. 12 is a configuration diagram illustrating a decoding unit according to an embodiment.

The decoding unit 320 or 720 illustrated in FIG. 3 or 7 may be configured, for example, as a circuit illustrated in FIG. 12, but this and the embodiments are not limited thereto.

Referring to FIG. 12, the decoding unit 320 or 720 may include an address generation unit 360, an enable signal generation unit 370, a selection signal generation unit 380, and a decoder 390.

The address generation unit 360 may be configured to generate a plural-bit address signal AX<K:0> in response to the counting signal ROD<M:0> generated in the counting unit 310 or 820.

The enable signal generation unit 370 may be configured to generate a plural-bit enable signal EN_MEAS<K−2:0> in response to a portion AX<K−2:0> (and inverting portion AX_B<K−2:0>) of the address signal AX<K:0> generated in the address generation unit 360.

The selection signal generation unit 380 may be configured to generate a plural-bit selection signal SEL<L:0> in response to the remaining portion AX<K:K−1> (and inverting remaining portion AX_B<K:K−1>) of the address signal AX<K:0> generated in the address generation unit 360.

The decoder 390 may be configured to generate the control signal EN<N:1> including first to fourth control signal groups EN_LVn<N:1>, EN_LVp<N:1>, EN_HVn<N:1>, and EN_HVp<N:1> in response to the selection signal SEL<L:0> and the enable signal EN_MEAS<K−2:0>.

Figure 13:
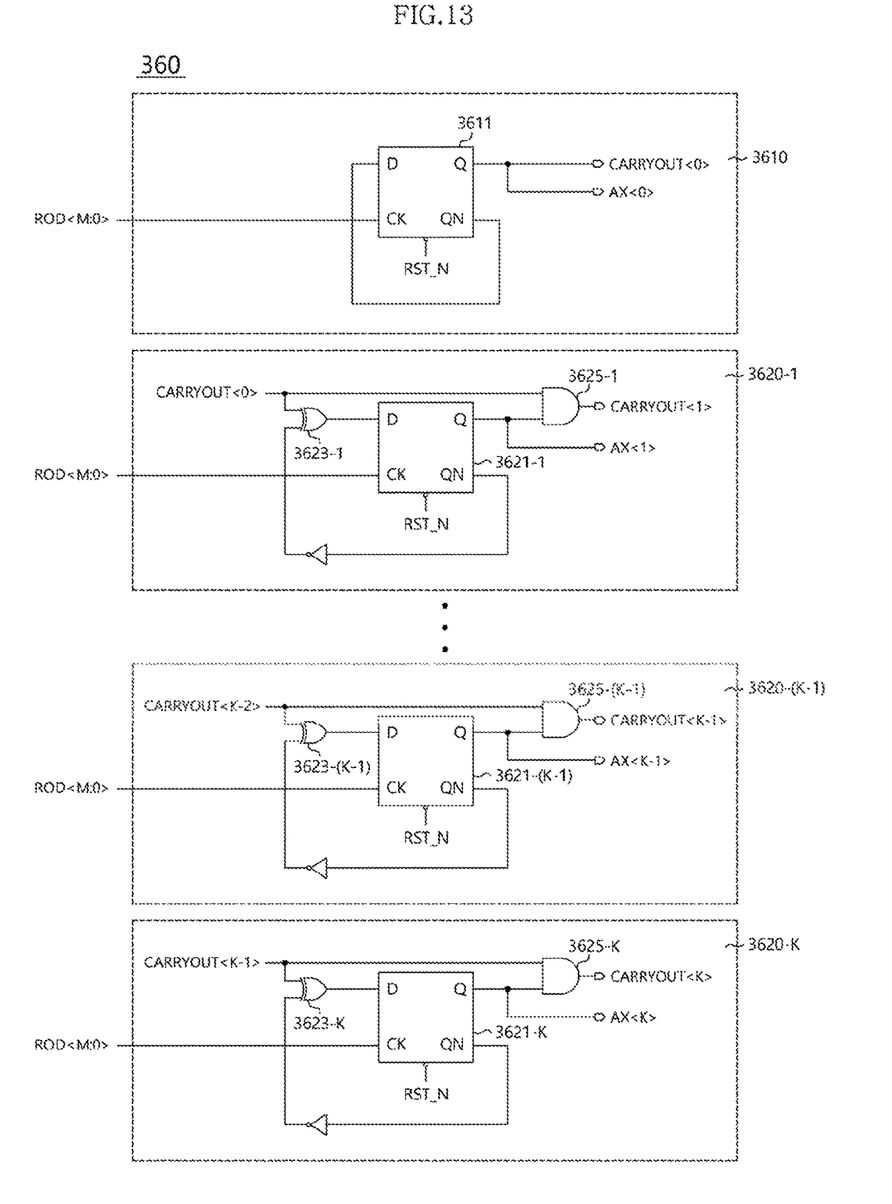
FIG. 13 is a configuration diagram illustrating an address generation unit according to an embodiment.

FIG. 13 is a configuration diagram illustrating an address generation unit according to an embodiment.

Referring to FIG. 13, the address generation unit 360 may include an initial carry generation unit 3610 and a plurality of adders 3620-1 to 3620-K.

The initial carry generation unit 3610 may include a flip flop circuit 3611 which receives the counting signal ROD<M:0> as a clock signal CK. The flip flop circuit 3611 may receive an inverting output signal QN thereof as an input signal D and generate an initial carry signal CARRYOUT<0> and a lowermost address signal AX<0> as an output signal.

Each of the adders 3620-1 to 3620-K may be configured to generate a carry signal and an address signal based on a carry signal of a previous stage in response to the counting signal ROD<M:0>. In an embodiment, each of the adders 3620-1 to 3620-K may include a flip flop circuit 3621-1 to 3621-K, an adding unit 3623-1 to 3623-K, and a carry output unit 3625-1 to 3625-K. The flip flop circuits 3611 and 3621-1 to 3621-K may be initialized in response to a reset signal RST_N.

The flip flop circuit 3621-1 to 3621-K may be configured to generate an address signal AX<1:K> by receiving an output signal of the adding unit 3623-1 to 3623-K as an input signal D in response to the counting signal ROD<M:0>. In an embodiment, the flip flop circuit 3621-1 to 3621-K may be configured to include a D flip flop.

The adding unit 3623-1 to 3623-K may be configured to perform an add operation by receiving a carry signal CARRYOUT<a> (a is an integer wherein 0≤a≤(k−1)) generated in a previous stage and an inverting signal of the inverting output signal of the flip flop circuit 3621-1 to 3621-K as an input signal.

The carry output unit 3625-1 to 3625-K may be configured to generate a carry signal CARRYOUT<a+1> in response to the carry signal CARRYOUT<a> generated in the previous stage and an output signal of the flip flop circuit 3621-1 to 3621-K.

Accordingly, the plural-bit address signal AX<K:0> may be generated through the address generation unit 360 as illustrated in FIG. 13.

Figure 14:
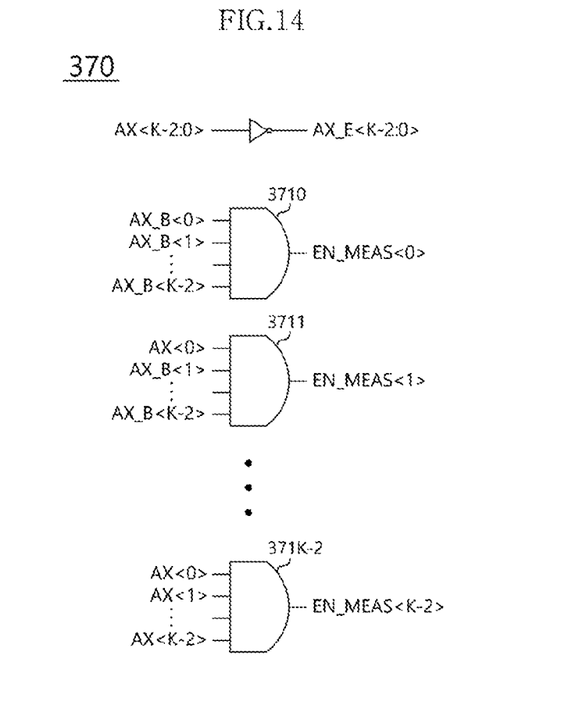
FIG. 14 is a configuration diagram illustrating an enable signal generation unit according to an embodiment.

FIG. 14 is a configuration diagram illustrating an enable signal generation unit according to an embodiment.

Referring to FIG. 14, the enable signal generation unit 370 may be configured to generate the plural-bit enable signal EN_MEAS<K−2:0> based on the portion AX<K−2:0> of the address signal AX<K:0>.

The enable signal generation unit 370 may be configured to include a first to a K−1-th enable signal generation unit 3710 to 371K-2 and configured to sequentially enable the first to K−1-th enable signal EN_MEAS<<0:K−2>.

Figure 15:
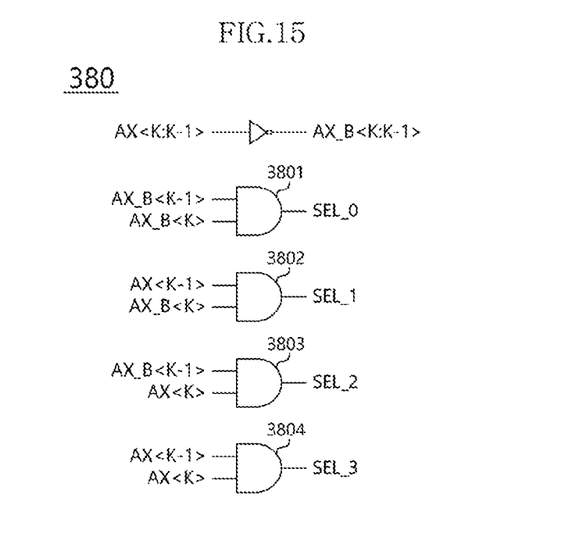
FIG. 15 is a configuration diagram illustrating a selection signal generation unit according to an embodiment.

FIG. 15 is a configuration diagram illustrating a selection signal generation unit according to an embodiment.

Referring to FIG. 15, the selection signal generation unit 380 may be configured to generate a plural-bit selection SEL<L:0> based on the remaining portion AX<K:K−1> of the address signal AX<K:0>. FIG. 15 illustrates that a four-bit selection signal SEL<3:0> is generated based on an uppermost two bit address signal AX<K: K−1>.

In an embodiment, the selection signal generation unit 380 may be configured to include first to fourth selection signal generators 3801 to 3804 and configured to generate the first to fourth selection signals SEL<0>, SEL<1>, SEL<2>, and SEL<3> according to a combination of the uppermost two bit address signal AX<K:K−1> and an inverting signal AX_B<K:K−1> of the uppermost two bit address signal AX<K: K−1>.

The number of bits in the selection signal SEL<L:0> may be changed according to the desired number of control signals, and the number of bits in the address signal AX used to generate the selection signal SEL<L:0> may be changed.

Figure 16:
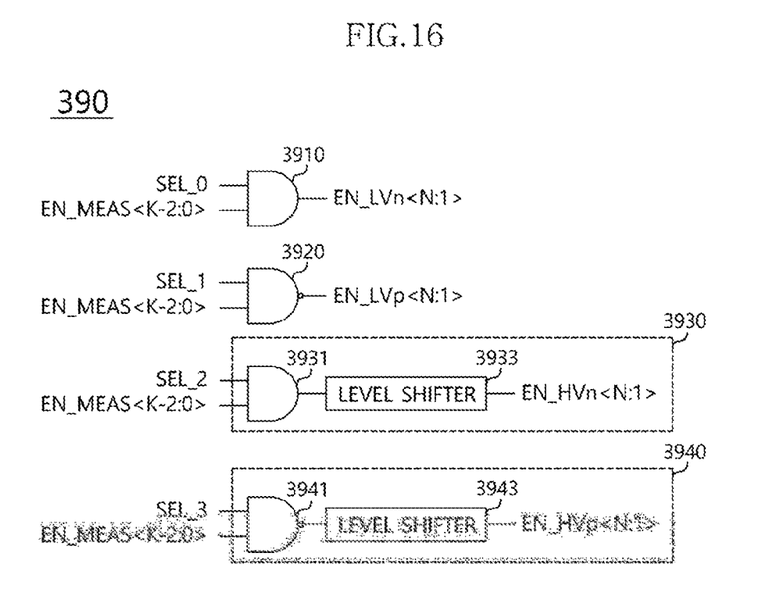
FIG. 16 is a configuration diagram illustrating a decoder according to an embodiment.

FIG. 16 is a configuration diagram illustrating a decoder according to an embodiment.

Referring to FIG. 16, a decoder 390 may be configured to generate the control signal EN<N:1> including the first to fourth control signal groups EN_LVn<N:1>, EN_LVp<N:1>, EN_HVn<N:1>, and EN_HVp<N:1> in response to the selection signal SEL<L:0> and the enable signal EN_MEAS<K−2:0>.

In an embodiment, the decoder 390 may include a first control signal generator 3910, a second control signal generator 3920, a third control signal generator 3930, and a fourth control signal generator 3940.

The first control signal generator 3910 may be configured to generate the first control signal group EN_LVn<N:1> in response to the first selection signal SEL_0 and the enable signal EN_MEAS<K−2:0>.

The second control signal generator 3920 may be configured to generate the second control signal group EN_LVp<N:1> in response to the second selection signal SEL_1 and the enable signal EN_MEAS<K−2:0>.

The third control signal generator 3930 may be configured to generate the third control signal group EN_HVn<N:1> in response to the third selection signal SEL_2 and the enable signal EN_MEAS<K−2:0>.

The fourth control signal generator 3940 may be configured to generate the fourth control signal group EN_HVp<N:1> in response to the fourth selection signal SEL_3 and the enable signal EN_MEAS<K−2:0>.

The third and fourth control signal generators 3930 and 3940 may include level shifters 3933 and 3934 to drive the plurality of high voltage NMOS transistor HVn and the plurality of high voltage PMOS transistors.

Figure 17:
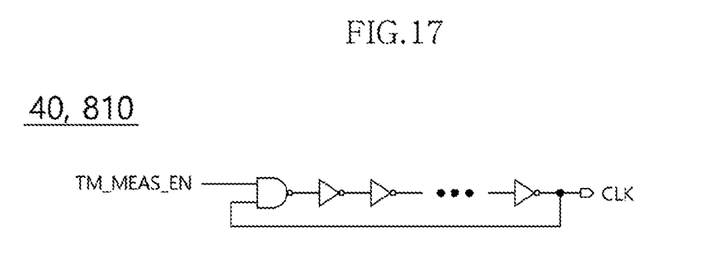
FIG. 17 is a configuration diagram illustrating a clock generation unit according to an embodiment.

The clock generation unit 40 or 810 illustrated in FIG. 4 or 8 may be configured, for example, as a circuit illustrated in FIG. 17.

Referring to FIG. 17, the clock generation unit 40 or 810 according to an embodiment may include an inverter chain configured to generate the clock signal CLK in response to the test enable signal TM_MEAS_EN. The inverter chain may be configured of the odd number of inverting units, and thus the clock generation unit 40 or 810 of FIG. 17 may be a ring oscillator.

The configurations of the counting unit, the decoding unit, and the clock generation unit as described above are only examples, and this and the embodiments are not limited to the configurations illustrated in FIGS. 10 to 17.

The above embodiments are illustrative and not limitative. Various alternatives and equivalents are possible. The description is not limited by the embodiments described herein. Nor is the embodiments limited to any specific type of semiconductor device. Other additions, subtractions, or modifications are obvious in view of the present disclosure and are intended to fall within the scope of the appended claims.

What is claimed is:

1. A semiconductor apparatus comprising:
a memory chip; and
a characteristic measurement circuit included within the memory chip and configured to include a plurality of unit elements for test and to output electrical characteristic information of the plurality of unit elements for test in a test mode,
wherein the plurality of unit elements for test include test-only unit elements that are used only for testing in the test mode and are not used in an actual operation of the memory chip, and
the characteristic measurement circuit includes:
a control signal generation unit configured to generate a control signal based on a test enable signal and a clock signal provided from the memory chip; and
a measurement unit configured to be driven based on the control signal.

2. The semiconductor apparatus of claim 1, wherein the plurality of unit elements for test are configured to include a MOS transistor.

3. The semiconductor apparatus of claim 1, wherein the plurality of unit elements for test include at least one of a plurality of low voltage NMOS transistors, a plurality of low voltage PMOS transistors, a plurality of high voltage NMOS transistors, and a plurality of high voltage PMOS transistors.

4. The semiconductor apparatus of claim 1, wherein the plurality of unit elements for test are configured to be driven with independent timings based on a control signal generated in the test mode.

5. The semiconductor apparatus of claim 1, wherein
a measurement unit configured to include the plurality of unit elements for test coupled to a first pad.

6. The semiconductor apparatus of claim 1, wherein the control signal generation unit includes:
a counting unit configured to generate a counting signal by counting the clock signal based on the test enable signal; and
a decoding unit configured to generate the control signal based on the counting signal.

7. The semiconductor apparatus comprising:
a memory chip; and
a characteristic measurement circuit included within the memory chip and configured to include a plurality of unit elements for test and to output electrical characteristic information of the plurality of unit elements for test in a test mode,
wherein the plurality of unit elements for test include test-only unit elements that are used only for testing in the test mode and are not used in an actual operation of the memory chip, and
the characteristic measurement circuit includes:
a control signal generation unit comprising a clock generation unit configured to generate a clock signal based on a test enable signal, and configured to generate a control signal based on the clock signal provided from the clock generation unit; and
a measurement unit configured to be driven based on the control signal.

8. The semiconductor apparatus of claim 1, wherein the characteristic measurement circuit includes:
a first measurement unit configured to output a counting signal to a first pad by counting the clock signal based on the test enable signal;
a decoding unit configured to generate the control signal based on the counting signal; and
a second measurement unit configured to be driven based on the control signal and include the plurality of unit elements for test coupled through a second pad.

9. The semiconductor apparatus of claim 8, wherein the first measurement unit is configured to measure a skew of the clock signal and a delay amount difference according to the skew.

10. A characteristic measurement circuit comprising:
a control signal generation unit configured to generate a control signal based on a test enable signal and a clock signal provided from the memory chip; and
a measurement unit configured to include a plurality of unit elements for test and to output electrical characteristic information of the plurality of unit elements for test based on the control signal, wherein the control signal generation unit and the measurement unit are included in a unit chip, wherein the plurality of unit elements for test include test-only unit elements that are used only for testing in a test mode and are not used in an actual operation of the memory chip.

11. The characteristic measurement circuit of claim 10, wherein the plurality of unit elements for test include a MOS transistor.

12. The characteristic measurement circuit of claim 10, wherein the plurality of unit elements for test include a plurality of low voltage NMOS transistors, a plurality of low voltage PMOS transistors, a plurality of high voltage NMOS transistors, and a plurality of high voltage PMOS transistors.

13. The characteristic measurement circuit of claim 10, wherein the plurality of unit elements for test are configured to be sequentially driven at independent timings based on the control signal.

14. The characteristic measurement circuit of claim 10, wherein the control signal generation unit includes:

a counting unit configured to generate a counting signal by counting the clock signal based on the test enable signal; and a decoding unit configured to generate the control signal based on the counting signal.

15. The characteristic measurement circuit comprising: a control signal generation unit comprising a clock generation unit configured to generate a clock signal based on the test enable signal, and configured to generate a control signal based on the clock signal provided from the clock generation unit; and a measurement unit configured to include a plurality of unit elements for test and to output electrical characteristic information of the plurality of unit elements for test based on the control signal, wherein the control signal generation unit and the measurement unit are included in a memory chip, wherein the plurality of unit elements for test include test-only unit elements that are used only for testing in a test mode and are not used in an actual operation of the memory chip.

16. The characteristic measurement circuit of claim 10, wherein the control signal generation unit includes:

a first measurement unit configured to output a counting signal to a first pad by counting a clock signal based on the test enable signal; and a decoding unit configured to generate the control signal based on the counting signal, wherein the measurement unit includes the plurality of unit elements for test driven based on the control signal and coupled to a second pad.

17. The semiconductor apparatus of claim 16, wherein the first measurement unit is configured to measure a skew of the clock signal and a delay amount difference according to the skew.

* * * * *